(12) United States Patent
Subramanian et al.

(10) Patent No.: US 12,512,851 B2
(45) Date of Patent: Dec. 30, 2025

(54) DIGITAL-TO-ANALOG CONVERTER CIRCUITRY

(71) Applicant: TEXAS INSTRUMENTS INCORPORATED, Dallas, TX (US)

(72) Inventors: Anand Subramanian, Bangalore (IN);
Tanmay Halder, Bangalore (IN);
Deepa Nair J S, Bengaluru (IN);
Sreeja Chakingal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 66 days.

(21) Appl. No.: 18/399,223

(22) Filed: Dec. 28, 2023

(65) Prior Publication Data

US 2025/0030436 A1 Jan. 23, 2025

(30) Foreign Application Priority Data

Jul. 20, 2023 (IN) .............................. 202341048847

(51) Int. Cl.
*H03M 3/00* (2006.01)
*H03K 19/0175* (2006.01)
*H03M 1/06* (2006.01)
*H03M 1/66* (2006.01)
*H03M 1/68* (2006.01)

(52) U.S. Cl.
CPC .... *H03M 3/324* (2013.01); *H03K 19/017545* (2013.01); *H03M 1/0624* (2013.01); *H03M 1/067* (2013.01); *H03M 1/66* (2013.01); *H03M 3/50* (2013.01); *H03M 1/68* (2013.01); *H03M 3/464* (2013.01)

(58) Field of Classification Search
CPC ...... H03M 3/324; H03M 3/50; H03M 1/0624; H03M 1/68; H03M 3/464; H03M 1/067; H03M 1/66; H03K 19/017545
USPC ......................................... 341/118, 143–144
See application file for complete search history.

(56) References Cited

U.S. PATENT DOCUMENTS 7,173,548 B2 * 2/2007 Yen ..................... H03M 1/0665
341/118
10,693,489 B2 * 6/2020 Roh ...................... H03M 3/502

OTHER PUBLICATIONS

Walt Kester; Basic DAC Architectures II: Binary DACs; Analog Devices MT-015 Tutorial; Oct. 2008; 10 pgs.

* cited by examiner

*Primary Examiner* — Khai M Nguyen
(74) *Attorney, Agent, or Firm* — Mandy Barsilai Fernandez; Frank D. Cimino (57) ABSTRACT

In a described example, a circuit includes a digital-to-analog converter (DAC) unit element switch circuit including first and second sign switch inputs, first and second select switch inputs, and first, second and third DAC outputs. Synchronizer logic includes a selection input and first and second synchronization outputs, in which the first synchronization output is coupled to the first select switch input and the second synchronization output is coupled to the second select switch input. Selection logic includes a data input, a sign control output and a selection control output, in which the sign control output is coupled to the first and second sign switch inputs, and the selection control output is coupled to the selection input.

22 Claims, 10 Drawing Sheets

| DATA | 2 | 3 | -4 | -5 | 3 | -2 | 4 | 5 | -3 | 0 | 1 |
|---|---|---|---|---|---|---|---|---|---|---|---|
| 0 | 1 | 0 | -1 | 0 | 0 | 0 | 1 | 0 | 0 | 0 | 0 |
| 1 | 1 | 0 | -1 | 0 | 0 | 0 | 0 | 0 | 0 | 0 | 0 |
| 2 | 0 | 0 | -1 | 0 | 1 | 0 | 0 | 0 | 0 | 0 | 0 |
| 3 | 0 | 0 | -1 | 0 | 1 | 0 | 0 | 0 | 0 | 0 | 0 |
| 4 | 0 | 0 | 0 | 0 | 1 | 0 | 0 | 0 | -1 | 0 | 0 |
| 5 | 0 | 0 | 0 | 0 | 0 | 0 | 1 | 0 | -1 | 0 | 0 |
| 6 | 0 | 0 | 0 | 0 | 0 | 0 | 1 | 0 | -1 | 0 | 0 |
| 7 | 0 | 0 | 0 | 0 | 0 | 0 | 1 | 0 | 0 | 0 | 0 |
| 8 | 0 | 1 | 0 | -1 | 0 | 0 | 0 | 0 | 0 | 0 | 1 |
| 9 | 0 | 1 | 0 | -1 | 0 | 0 | 0 | 0 | 0 | 0 | 0 |
| 10 | 0 | 1 | 0 | -1 | 0 | 0 | 0 | 0 | 0 | 0 | 0 |
| 11 | 0 | 0 | 0 | -1 | 0 | 0 | 0 | 1 | 0 | 0 | 0 |
| 12 | 0 | 0 | 0 | -1 | 0 | 0 | 0 | 1 | 0 | 0 | 0 |
| 13 | 0 | 0 | 0 | 0 | 0 | -1 | 0 | 1 | 0 | 0 | 0 |
| 14 | 0 | 0 | 0 | 0 | 0 | -1 | 0 | 1 | 0 | 0 | 0 |
| 15 | 0 | 0 | 0 | 0 | 0 | 0 | 0 | 1 | 0 | 0 | 0 |

DIGITAL-TO-ANALOG CONVERTER CIRCUITRY

RELATED APPLICATIONS

This application claims priority to Indian Provisional Patent Application Ser. No. 202341048847, filed 20 Jul. 2023, which is incorporated herein by reference in its entirety.

TECHNICAL FIELD

This description relates to digital-to-analog converters and to systems that include digital-to-analog converters.

BACKGROUND

A digital-to-analog converter (DAC) is a device that converts a digital signal into an analog signal. DACs can be considered an enabling technology or building block finding applications in many technologies, such as audio, video, and communications to name a few. As an example, a delta-sigma modulator analog-to-digital converter can include a multi-bit DAC as part of a feedback loop. The multi-bit DAC includes a number of DAC unit elements, which transition between states responsive to a digital input signal. When errors or mismatches exist in the transitions being made, errors can result in the nature of inter-symbol interference among the unit elements. Inter-symbol interference can produce nonlinearity, which in turn can cause harmonic distortions and ultimately degrade the dynamic range of the circuitry.

SUMMARY

In a described example, a circuit includes a digital-to-analog converter (DAC) unit element switch circuit including first and second sign switch inputs, first and second select switch inputs, and first, second and third DAC outputs. Synchronizer logic includes a selection input and first and second synchronization outputs, in which the first synchronization output is coupled to the first select switch input and the second synchronization output is coupled to the second select switch input. Selection logic includes a data input, a sign control output and a selection control output, in which the sign control output is coupled to the first and second sign switch inputs, and the selection control output is coupled to the selection input.

In another described example, a circuit includes a plurality of digital-to-analog converter (DAC) unit elements. Each DAC unit element includes a unit element switch circuit, synchronizer logic and sign logic. The unit element switch circuit of each unit element is configured to provide one of three values responsive to first and second sign output signals and first and second synchronization output signals. The synchronizer logic of each unit element is configured to provide the first and second synchronization output signals responsive to a selection signal. The sign logic of each unit element is configured to provide the first and second sign output signals responsive to a sign control signal. Selection logic is configured to divide the plurality of unit elements into first and second segments and to provide the selection signal and the sign control signal to route input data to at least one DAC unit element of a given one of the first and second segments such that consecutive overlap transitions are prevented.

In a further described example, an apparatus includes a digital interface including a digital input and a digital output. A digital filter includes a filter input and a filter output, in which the filter input is coupled to the digital output. Selection logic includes a data input, a selection output and a sign output, in which the data input is coupled to the filter output. A synchronizer logic circuit includes a selection input, a clock input and first and second synchronization outputs, in which the selection input is coupled to the selection output. A sign logic circuit includes a sign input and first and second sign control outputs, in which the sign input is coupled to the sign output. The apparatus also includes a digital-to-analog converter (DAC) unit element switch circuit including first and second sign switch inputs, first and second select switch inputs, and a DAC output. The first select switch input is coupled to the first synchronization output and the second select switch input is coupled to the second synchronization output. The first sign switch input is coupled to the first sign control output and the second sign switch input is coupled to the second sign control output.

DETAILED DESCRIPTION

This description relates to digital-to-analog converters and to systems that include digital-to-analog converters.

As an example, a circuit includes one or more digital-to-analog converter (DAC) unit elements (UEs). Each UE includes a UE switch circuit and synchronizer logic. Each UE can also include sign logic. Each UE switch circuit can include a network of parallel switch paths, in which each of the switch paths provides a different output state (e.g., a current and/or voltage value) at a respective path output for the UE. For example, each UE switch circuit provides one of three (or more) different output values, such as 3 values representative of respective output states (e.g., +1, 0 and −1). A given one of the switch paths thus provides an output value at the respective path output thereof responsive to a sign output signal and a synchronization output signal. The synchronizer logic provides the synchronization output signal responsive to a selection signal, and the sign logic provides sign output signals responsive to a sign control signal.

The circuit also includes selection logic configured to divide the plurality of UEs into first and second segments of UEs, and to provide the selection signal and the sign control signal to control routing of input data to one or more UEs in a selected one of the first and second segments of UEs. As described herein, the selection logic selects one of the segments of UEs for routing input data to avoid consecutive overlap transitions. An overlap transition refers to a state transition for a respective UE that involves a sign change, such as from +1 to −1 or from −1 to +1. Thus, the selection logic can constrain state transitions for the UEs to include 0 to +1, 0 to −1, +1 to 0, and −1 to 0. Also, or as an alternative, the selection logic can provide the selection signal, as a selection vector, to control the output values provided by a number of one or more UEs of the selected segment based on input data (e.g., a digital input value). Advantageously, the transitions for each UE can be synchronized using only a single synchronizer for each UE responsive to the respective selection and sign control signals provided to each respective UE. The improved synchronization between transitions can result in reduced noise (e.g., inter-symbol interference) at the DAC output, which can improve the dynamic range.

Figure 1:
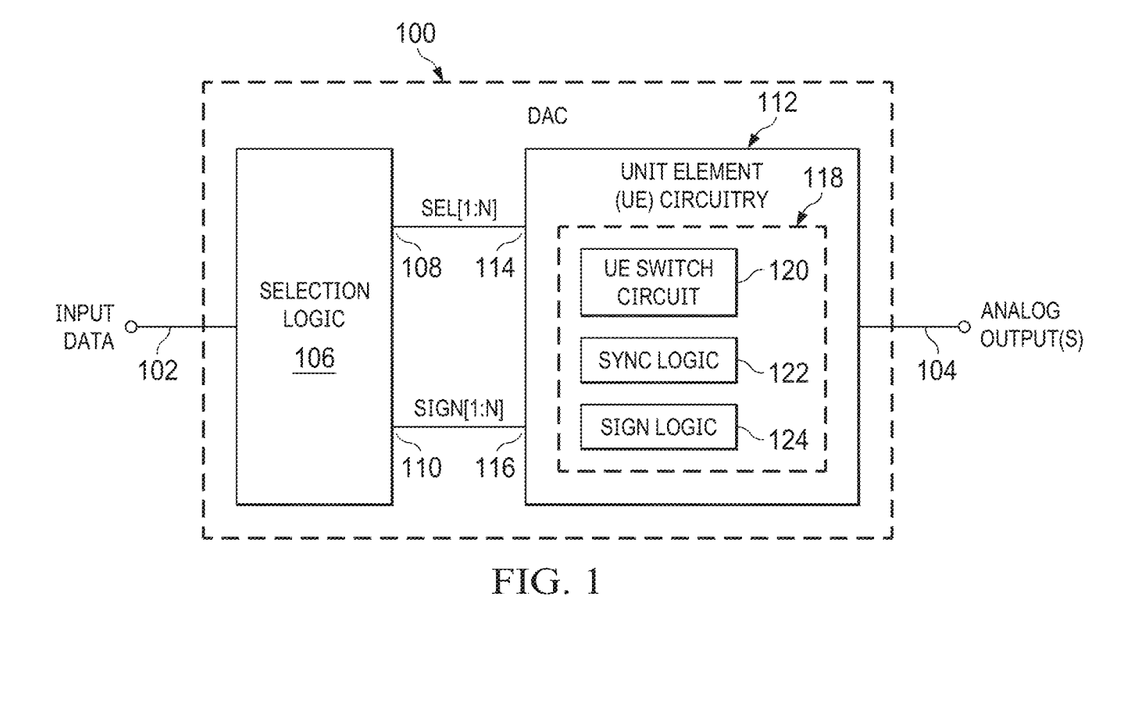
FIG. 1 is a block diagram showing an example DAC circuit.

FIG. 1 is a block diagram showing an example DAC circuit (also referred to as a DAC) 100 having a digital input 102 and an analog output 104. As an example, the DAC 100 can be implemented on or as part of an integrated circuit (IC). The DAC 100 includes selection logic 106 and unit element (UE) circuitry 112. The selection logic 106 has an input coupled to the digital input 102. The selection logic 106 also has a number N selection control outputs 108 and N sign control outputs 110, where N is a positive integer representative of the number UEs implemented in DAC UE circuitry 112. The UE circuitry 112 has N selection inputs 114 and N sign inputs 116, which are coupled to respective selection control outputs 108 and sign control outputs 110 (e.g., through respective control lines). The selection logic 106 can provide selection signals at 108 and sign control signals at 110 based on a value of input data (e.g., a digital value) received at 102. The UE circuitry 112 can provide an analog output signal at 104 representative of the value of the input data based on routing of input data (e.g., bits) to respective UEs 118 according to the selection signals and sign control signals received at 114 and 116, respectively.

As described herein, the UE circuitry 112 includes a number of N UEs 118, one of which is shown in the example of FIG. 1. Each UE 118 can be a one-bit DAC configured to convert a respective one-bit input (e.g., encoded by the selection logic 106) into the analog domain. In the examples described herein, the DAC 100 is a class B DAC, and each UE 118 can be a tri-state (or 3-level) unit element configured to provide one of at least three different output values having different levels, such as a positive voltage, a negative voltage, and a mid-point or common-mode voltage (e.g., reference voltages P, CM, and M). The outputs of the respective DAC UEs 118 can be combined to produce one or more analog output signals at 104, which is representative of the original digital signal at 102.

As shown in FIG. 1, each UE 118 can include a UE switch circuit 120, synchronizer logic (also referred to as a synchronizer) 122, and sign logic 124. Each sign logic 124 can provide a pair of opposite sign signals at respective first and second sign outputs responsive to a sign input signal at the sign input 116, such as representative of the sign of the number being provided the respective UE 118. Each synchronizer logic 122 can provide a pair of synchronized selection signals at the first and second synchronization outputs, in which first and second synchronized selection signals are inverted versions of each other responsive to the selection signal at the selection input 114 for the respective UE 118. Each UE switch circuit 120 can provide a respective UE output signal having a value (e.g., state) depending on the synchronized selection signals and the sign signals for the respective UE 118. The UE switch circuit 120 can include a unit current source, a unit resistor or a unit capacitor circuit, or a combination thereof. Other types of DAC UEs can be used in other examples. The UE output signals are combined to produce the analog output signal at 104.

As described herein, the selection logic 106 can control transitions between states for each of the UEs 118 to avoid consecutive overlap transitions (e.g., consecutive sign changes in UE output states). For example, the selection logic 106 divides the DAC UEs 118 into two segments, such as each with half the number of UEs. The selection logic 106 further can be configured to use a pair of separate pointers for tracking positive and negative input values for each of the segments of UEs (e.g., four pointers in total-two pointers for each segment). The selection logic 106 further can be configured to use a pair of usage variables to track segment usage for respective positive and negative data values, respectively (e.g., four usage variables in total-two usage variables for each of the segments). The selection logic 106 provides the selection signal at 108 to control the UE circuitry by providing a selection vector adapted to route data bits to one or more UEs in the appropriate segment that avoids overlap transitions (e.g., transitions between −1 and +1). As a result, responsive to the selection signals and sign signals, each unit element has only 4 transitions of concern (e.g., transitions between 0 and +/−1), which can be synchronized, as described herein using one synchronized SEL bit and an asynchronous SIGN bit. By preventing (or reducing) overlap transitions for the UEs, noise (e.g., due to inter-symbol interference) can be reduced. Additionally, each UE 118 can be implemented with a single synchronizer compared to existing approaches that tend to require more than synchronizer. As a result, the UE circuitry can be implemented on a given IC using a smaller amount of area and have reduced power requirements compared to many existing approaches.

Figure 2:
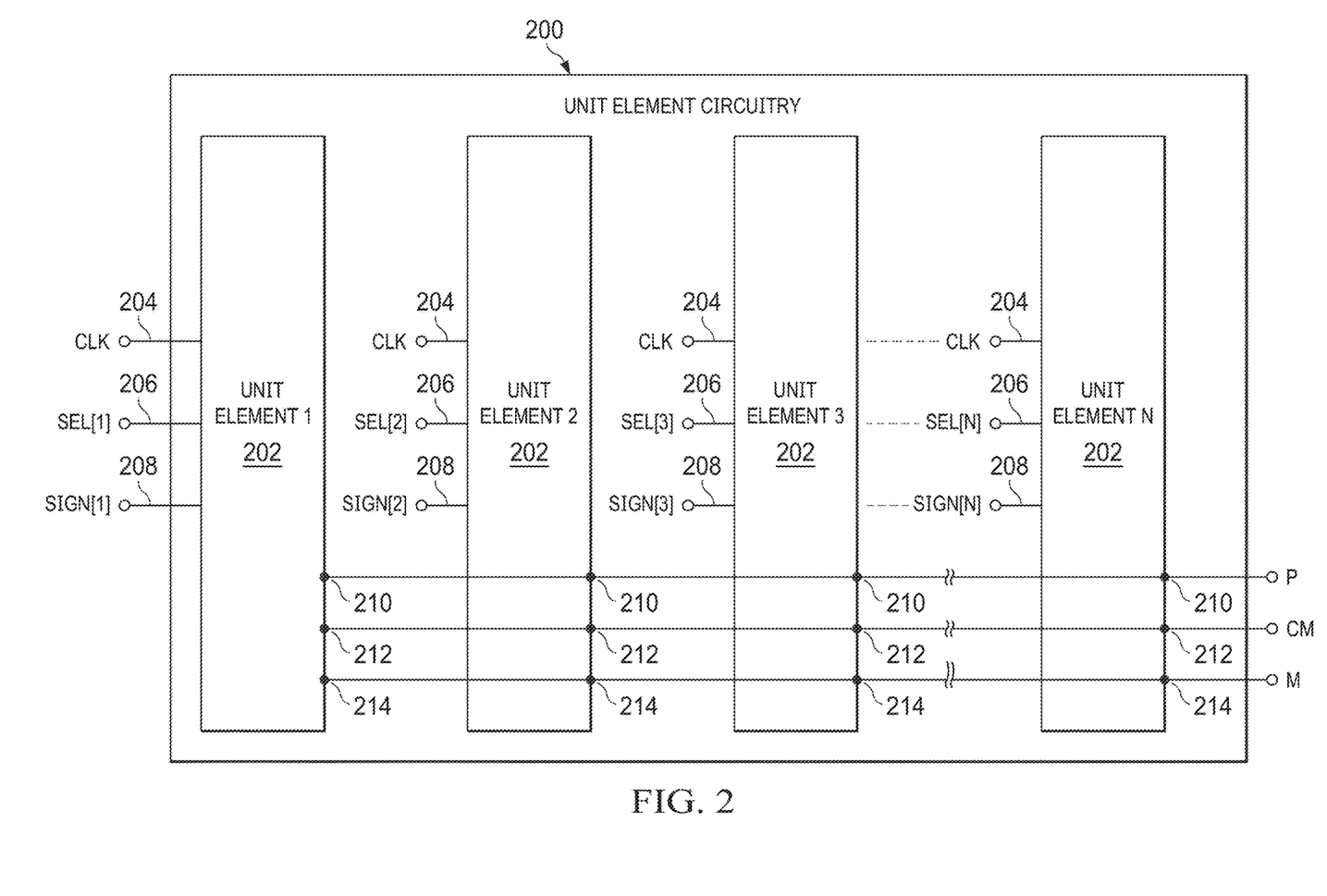
FIG. 2 is a block diagram of example unit element circuitry that can be implemented in a DAC circuit.

FIG. 2 is a block diagram of example UE circuitry 200 that can be implemented in a DAC circuit, such as circuits described herein. The UE circuitry 200 is an example of the UE circuitry 112 described with respect to FIG. 1. Accordingly, the description of FIG. 2 also refers to the example of FIG. 1. The UE circuitry 200 includes a plurality of UEs 202, shown as UE 1 through UE N. Each UE 202 includes a clock input (CLK) 204, a selection input (SEL[i]) 206, and a sign input (SIGN[i]) 208, where i is a positive integer identifying the respective UE (i=1 to N). Each UE 202 also has respective outputs 210, 212, and 214, in which the UEs are configured to provide UE output signals having different levels (states) at each respective output. In the example of FIG. 2, the outputs 210, 212, and 214 of the respective UEs 202 are each coupled (e.g., shorted) together to provide a combined analog output at each of the respective UE outputs, such as a positive voltage, a negative voltage, and a common-mode voltage (shown as P, CM and M). As described herein, each UE 202 can include a UE switch circuit (e.g., UE switch circuit 120), synchronizer logic (e.g., synchronizer logic 122), and sign logic (e.g., sign logic 124) configured to provide the analog UE output signals P, CM, and M at respective outputs 210, 212 and 214.

Figure 3:
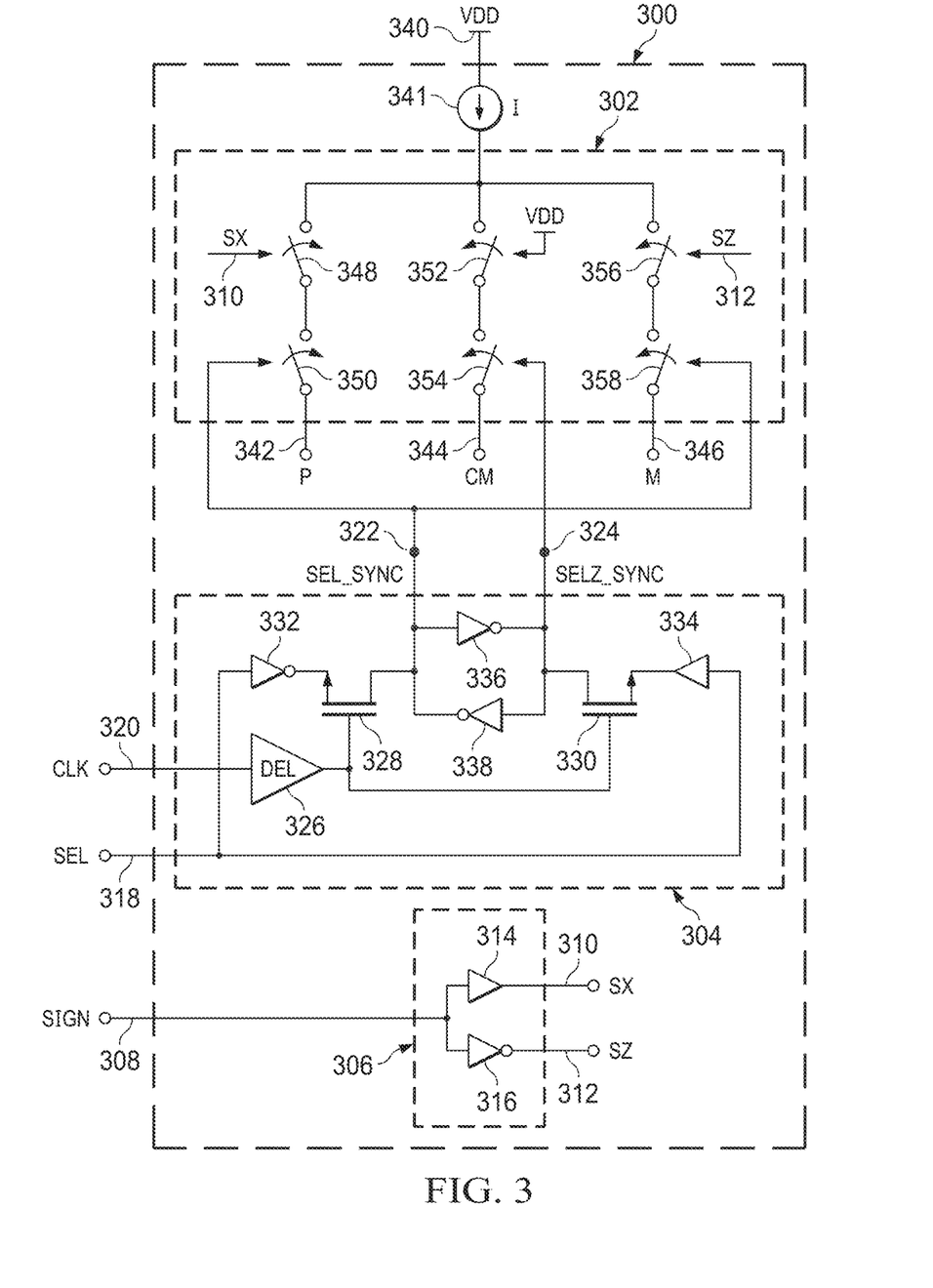
FIG. 3 is a circuit diagram showing an example DAC unit element.

FIG. 3 is a circuit diagram showing an example DAC UE 300. The UE 300 is an example of the UEs 118 and 202 described with respect to FIGS. 1 and 2. Accordingly, the description of FIG. 3 also refers to the example of FIGS. 1 and 2. A DAC circuit, thus, can include a plurality of instances of the UE 300.

The UE 300 includes a UE switch circuit 302, synchronizer logic 304, and sign logic 306. The sign logic 306 can be implemented as digital logic having a sign input 308 and a pair of sign outputs 310 and 312. In the example of FIG. 3, the sign logic 306 includes a digital buffer 314 coupled between the sign input 308 and the sign output 310, and an inverter 316 coupled between the sign input 308 and the sign output 312. The sign input 308 can be coupled to the sign control output of selection logic (e.g., selection logic 106). The sign logic 306 thus provides sign logic signals having opposite logic values at the respective sign outputs 310 and 312 responsive to a sign control signal (e.g., a one-bit logic signal) at the sign input 308 (e.g., provided by the selection logic 106).

The synchronizer logic 304 can be implemented as digital logic having a selection input 318, a clock input 320 and synchronization outputs 322 and 324. In the example of FIG. 3, the synchronizer logic 304 includes a buffer 326, a buffer 334, inverters 332, 336, and 338, and transistors 328 and 330. The buffer 326 has an input coupled to the clock input 320 and an output coupled to control inputs (e.g., gates) of the transistors 328 and 330. The inverter 332 has an input coupled to the selection input 318 and an output coupled to a first current input (e.g., source) of the transistor 328. Current inputs of a transistor may also be referred to as terminals, and control inputs of a transistor may also be referred to as control terminals. The buffer 334 has an input coupled to the selection input 318 and an output coupled to a first current input (e.g., source) of the transistor 330. The inverter 332 and buffer 334 are thus configured to provide opposite logic signals the respective transistor inputs responsive to the selection logic signal at 318, while the clock signal at 320 is used to control (e.g., turn on and off) the transistors 328 and 330 responsive to the clock signal. The synchronization output 322 is coupled to a second current input (e.g., drain) of the transistor 328 and the synchronization output 324 is coupled to the second current input (e.g., drain) of the transistor 330. The pair of inverters 336 and 338 are coupled in anti-parallel between respective second current inputs (e.g., drains) of the transistors 328 and 330. The synchronizer logic 304 can provide first and second synchronized selection signals at the synchronization outputs 322 and 324 responsive to the selection signal at 318 and the clock signal at 320. The inverters 336 and 338 are thus configured to ensure that the first and second synchronized selection signals at 322 and 324 remain synchronized and are inverted versions of each other.

The UE switch circuit 302 includes UE output switch paths, each coupled between a power supply terminal 340 and a respective UE output 342, 344 and 346. The UE output switch paths include switches 348, 350, 352, 356, and 358. In the example of FIG. 3, the power supply terminal can be coupled to a power supply configured to provide a supply voltage, shown as VDD. A current source (or other circuitry, such as resistor) 341 can be coupled between the power supply terminal 340 and inputs to each switch path configured to provide current to the respective switch paths.

Each switch path can include two or more switches coupled between the power supply terminal 340 and the respective DAC output. A first switch path includes switches 348 and 350 coupled between the current source 341 and the UE output 342. The switch 348 has a control input coupled to the first sign switch output 310, and the switch 350 has a control input coupled to the synchronization output 322. A second switch path includes switches 352 and 354 coupled between the current source 341 and the UE output 344. The switch 356 has a control input coupled to the switch output 312, and the switch 358 has a control input coupled to the synchronization output 322. A third switch path includes switches 356 and 358 coupled between the current source 341 and the UE output 346. The switch 352 has a control input coupled to a fixed voltage (e.g., VDD) to remain turned on, and the other switch 354 has a control input coupled to the synchronization output 324. The switches 348 to 358 can be implemented as identical switches (e.g., transistors), the always-on switch 352 can be provided so that each of the switch paths has the same resistance. Other circuitry can be used to provide a common resistance and suitable switching among the switch paths.

The UE switch circuit 302 can provide a UE output signal having a corresponding value P, CM, or M at one of the respective outputs 342, 344, 346 responsive to the synchronized selection signals at 322 and 324 and sign signals at 310 and 312. As described herein, the UE switch circuit 302 is controlled (e.g., by the selection logic 106) to avoid consecutive overlap transitions at the outputs 342, 344, and 346.

Figure 4:
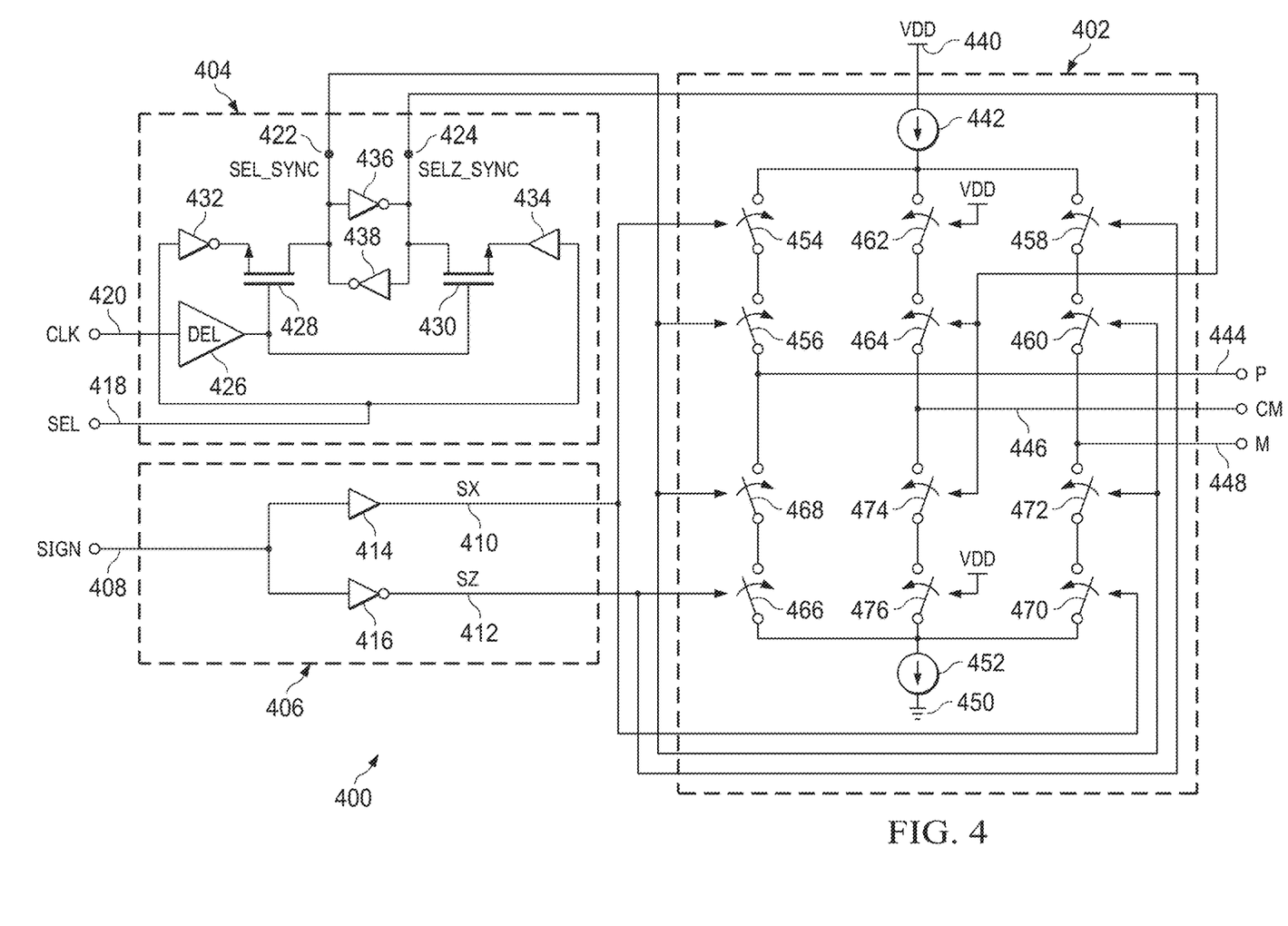
FIG. 4 is a circuit diagram showing another example DAC unit element.

FIG. 4 is a circuit diagram showing another example DAC UE 400, in which the UE element is configured to provide a differential analog output signal. The UE 400 is an example of the UEs 118 and 202 described with respect to FIGS. 1 and 2, and is a differential version of the singled-ended example UE 300 of FIG. 3. The UE 400 includes a UE switch circuit 402, synchronizer logic 404, and sign logic 406. In the example of FIG. 4, the synchronizer logic 404 and sign logic 406 can be implemented by identical logic circuits as shown in FIG. 3, and the UE switch circuit 402 is a differential circuit compared to the single-ended UE switch circuit 302 of FIG. 3. Accordingly, the description of FIG. 4 also refers to the example of FIGS. 1, 2, and 3.

In the example of FIG. 4, the sign logic 406 includes a digital buffer 414 coupled between the sign input 408 and the sign output 410 and an inverter 416 coupled between the sign input 408 and the sign output 412. The sign input 408 can be coupled to a sign control output of selection logic (e.g., selection logic 106). The synchronizer logic 404 can be implemented as digital logic having a selection input 418, a clock input 420 and synchronization outputs 422 and 424. The synchronizer logic 404 includes a buffer 426, a buffer 434, inverters 432, 436, and 438, and transistors 428 and 430. The buffer 426 has an input coupled to the clock input 420 and an output coupled to control inputs (e.g., gates) of transistors 428 and 430. An inverter 432 has an input coupled to the selection input 418 and an output coupled to a first current input (e.g., source) of the transistor 428. A buffer 434 has an input coupled to the selection input 418 and an output coupled to a first current input (e.g., source) of the transistor 430. The synchronization output 422 is coupled to a second current input (e.g., drain) of the transistor 428 and the synchronization output 424 is coupled to the second current input (e.g., drain) of the transistor 430. A pair of inverters 436 and 438 are coupled in anti-parallel between respective second current inputs (e.g., drains) of the transistors 428 and 430. The synchronizer logic 404 can provide first and second synchronized selection signals at the synchronization outputs 422 and 424 responsive to the selection signal at 418 and the clock signal at 420.

The UE switch circuit 402 includes differential UE output switch paths. A first (e.g., positive) set of switch paths is coupled between a power supply terminal 440 and a respective UE output 444, 446 and 448. The first set of switch paths includes switches 454, 456, 458, 460, 462, and 464. A current source (or other circuitry, such as resistor, capacitor and/or other unit element circuitry) 442 can be coupled between the power supply terminal 440 (e.g., coupled to VDD) and inputs to each switch path configured to provide current to the respective switch paths. A second (e.g., negative) set of switch paths is coupled between a ground terminal 450 and a respective one of the UE outputs 444, 446, and 448. The second set of switch paths includes switches 466, 468, 470, 472, 474, and 476. Another current source (or other circuitry, such as resistor) 452 can be coupled between the ground terminal 440 and inputs to each switch path configured to provide current to the respective switch paths. Each positive switch path can include two or more switches coupled between the power supply terminal 440 and the respective DAC output 444, 446, 448, and each negative switch path can include two or more switches coupled between the ground terminal 450 and the respective DAC output.

A first positive switch path includes switches 454 and 456 coupled between the current source 442 and the UE output 444. The switch 454 has a control input coupled to the first sign switch output 410, and the switch 456 has a control input coupled to the synchronization output 422. A second positive switch path includes switches 458 and 460 coupled between the current source 442 and the UE output 448. The switch 458 has a control input coupled to the sign output 412, and the switch 460 has a control input coupled to the synchronization output 422. A third positive switch path includes switches 462 and 464 coupled between the current source 442 and the UE output 446. The switch 462 has a control input coupled to a fixed voltage (e.g., VDD), and the other switch 464 has a control input coupled to the synchronization output 424.

A first negative switch path includes switches 466 and 468 coupled between the current source 452 and the UE output 444. The switch 466 has a control input coupled to the second sign switch output 412, and the switch 468 has a control input coupled to the synchronization output 422. A second negative switch path includes switches 470 and 472 coupled between the current source 452 and the UE output 448. The switch 470 has a control input coupled to the sign output 412, and the switch 472 has a control input coupled to the synchronization output 422. A third negative switch path includes switches 474 and 476 coupled between the current source 442 and the UE output 446. The switch 474 has a control input coupled to a fixed voltage (e.g., VDD), and the other switch 476 has a control input coupled to the synchronization output 424.

The UE switch circuit 402 can provide a differential analog UE output signal at 444, 446 and 448 (e.g., P, CM, and M), in which the P and M signals across 444 and 448 provides a differential positive or negative signal and the CM signal at 446 provides a midpoint (common mode) signal. As described herein, the UE switch circuit 402 is controlled (e.g., by the selection logic 106) to avoid consecutive overlap transitions in the UE output signal provided at the outputs 442, 444, and 446.

Figure 5:
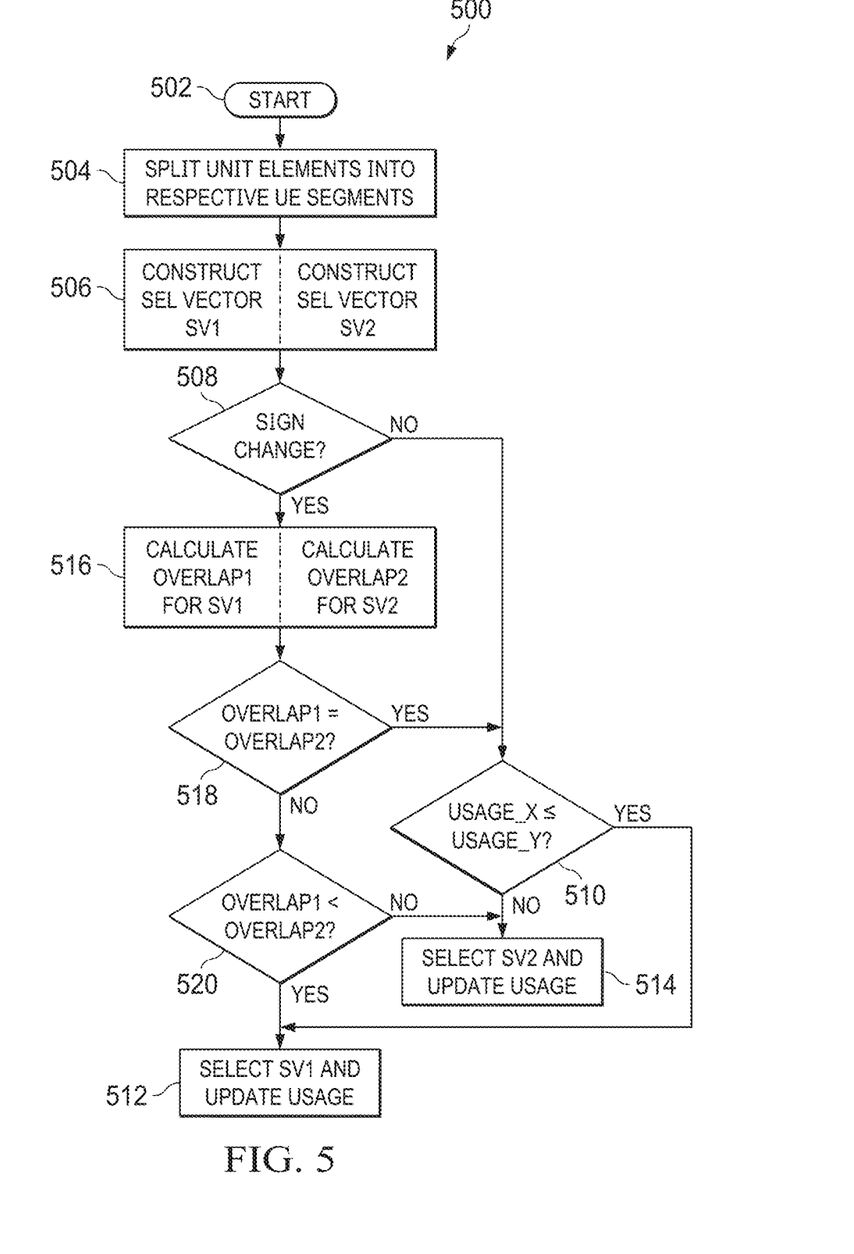
FIG. 5 is a flow diagram showing an example method for controlling a DAC.

FIG. 5 is a flow diagram showing an example method 500 for controlling a DAC. The method 500 is an example of the function that the selection logic 106 can be configured to perform for controlling UE circuitry 112 and 200 and UEs thereof, such as described with respect to FIGS. 1, 2, 3, and 4. Accordingly, the description of FIG. 5 also refers to the example of FIGS. 1, 2, 3, and 4. While, for purposes of simplicity of explanation, the method 500 is shown and described as executing serially, such methods are not limited by the illustrated order. Some actions could occur in different orders and/or concurrently from that shown. Moreover, not all illustrated blocks may be required to implement the method 500. The method may be implemented by hardware (e.g., logic circuitry and memory in an IC, a field programmable gate array (FPGA) and/or by discrete components within an IC), firmware and/or software (e.g., machine readable instructions stored in non-transitory media and executed by a processor or controller) or a combination of hardware and software.

The method begins at 502, such as at power-up of an IC or other type of apparatus that includes the DAC configured to perform. As described herein, the DAC includes a number N of unit elements. The DAC also has an input at which input data (e.g., a digital value V) is received. At 504, the UEs are divided into respective segments of UEs. The segments of UEs can be referred to as segments X and Y. In an example, each of the segments X and Y includes N/2 of UEs. Also, at 504, the input data V is split into two portions A and B. In some examples, where the input data V has a number of bits $|V|=<N/2$, $A=V$, and $B=0$, such that all the input data remains together. In other examples, segment $A=sign(V)*N/2$ and segment $B=V-A$.

As a further example, as part of the method 500, the selection logic (e.g., selection logic 106) can to use a number of pointers to track the positive numbers and the negative number for each segment X and Y (e.g., four total pointers). The selection logic, thus, uses the pointers to track the positive and negative numbers that are exercised by such pointers. For example, PTRPX is the positive pointer for segment X, PTRMX is the negative pointer for segment X, PTRPY is the positive pointer for segment Y, PTRMY is the negative pointer for segment Y. The selection logic can also implement usage variables each to track the positive and negative input data values exercised through such variables. UXP is the sum of the positive values exercised by segment X, UXM is the sum of the negative values through segment X, UYP is the sum of the positive values exercised by segment Y, UYM is the sum of the negative values through segment Y. Similar for UYP and UYM. The pointers and variables can be stored in memory (e.g., registers, such flip-flops) and updated by the selection logic as values of the input data are converted from the analog to the digital domain by selected UEs.

At 506, selection vectors are constructed. For example, two selection vectors (SV1 and SV2) are constructed to provide respective options that can be used (e.g., by selection logic) for controlling in which segment of UEs (X or Y) the input data is provided. The first selection vector SV1 can be provided in which the portion A of the input signal is assigned to segment X and portion B is assigned to segment Y (e.g., A→X and B→Y). The second selection vector SV2 can be provided in which the portion A of the input signal is assigned to segment Y and portion B is assigned to segment X (e.g., A→Y and B→X). Thus, when a given selection vector is selected, the bits of the input data V are provided to UEs in one or more of the segments according to the selected given selection vector.

At 508, a determination is made as to whether there is a sign change between the current input data V(n) and a previous instance of the input data V(n−1), where n denotes the current instance and n−1. In an example, the sign change is computed by determining $V(n)*V(n-1)<0$. If the determination at 508 is negative, indicating no sign change (e.g., no overlap transition), the method proceeds to 510. At 510, usage score values for each of segments X and Y (e.g., USAGE_X and USAGE_Y) are evaluated. For example, usage variable USAGE_X and USAGE_Y that store values to track the amount that each segment X and Y is used based on the number of bits of input data received in each respective segment over time. The usage variables USAGE_X and USAGE_Y can track the positive negative values (e.g., USAGE_X=UXP+UXM and USAGE_Y=UYP+UYM). Each usage variable can be updated each iteration of the method 500 and can vary depending on which selection vector option is chosen, as described herein (at 512 and 514). At 510, if USAGE_X<=USAGE_Y, the method proceeds to 512. At 512, the method selects selection vector option SV1 and updates the associated usage variable for the selected segment (e.g., usage of segments X and/or Y) based on the input value V(n). For example, at 512, the usage of variables for segments X and Y can be updated as follows:

$$USAGE\_X(n) = USAGE\_X(n-1) + |A|$$
$$USAGE\_Y(n) = USAGE\_Y(n-1) + |B|$$

where: n denotes the current cycle;
n−1 denotes the previous cycle;
|A| represents the number of bits of current input data V(n) in portion A; and
|B| represents the number of bits of current input data V(n) in portion B.

At 510, if USAGE_X>USAGE_Y, the method proceeds to 514. At 514, the method selects selection vector SV2 and updates the associated usage variable for the selected segment (e.g., usage of segments X and Y) based on the input value V(n). For example, at 514, the usage of variables for segments X and Y can be updated as follows:

$$USAGE\_X(n) = USAGE\_X(n-1) + |B|; \text{ and}$$
$$USAGE\_Y(n) = USAGE\_Y(n-1) + |A|.$$

Responsive to the determination at 508 being positive, indicating the occurrence of a sign change (e.g., an overlap transition), the method proceeds to from 508 to 516. At 516, overlap scores are computed for each of the selection vectors (e.g., SV1 and SV2) that was constructed at 506. For example, if there is a data sign change, overlap is calculated by bitwise ANDing SV(n−1) with each of the selection vectors SV1 and SV2 determined for the current input value (at 506) to provide respective overlap values (e.g., OVERLAP1 and OVERLAP2) for the respective selection vector options SV1 and SV2. At 518, a determination is made about whether the overlaps are equal (e.g., OVERLAP1=OVERLAP2). If the determination at 518 is positive indicating that the overlaps are equal, the method proceeds to 510 to select the selection vector option based on segment usage, such as described herein. If the determination at 518 is negative indicating that the overlaps are not equal, the method proceeds to 520. At 520, a termination is made as to whether the overlap for SV1 is less than the overlap for SV2 (e.g., OVERLAP1<OVERLAP2). If the determination at 520 is negative, indicating that OVERLAP1 is not less than OVERLAP2, the method proceeds to 514 to select SV2 and update the usage variable accordingly. If the determination at 520 is positive, indicating that OVERLAP1 is less than OVERLAP2, the method proceeds to 512 to select SV1 and update the usage variable accordingly. The method 500 can be implemented for each digital input value.

Figure 6:
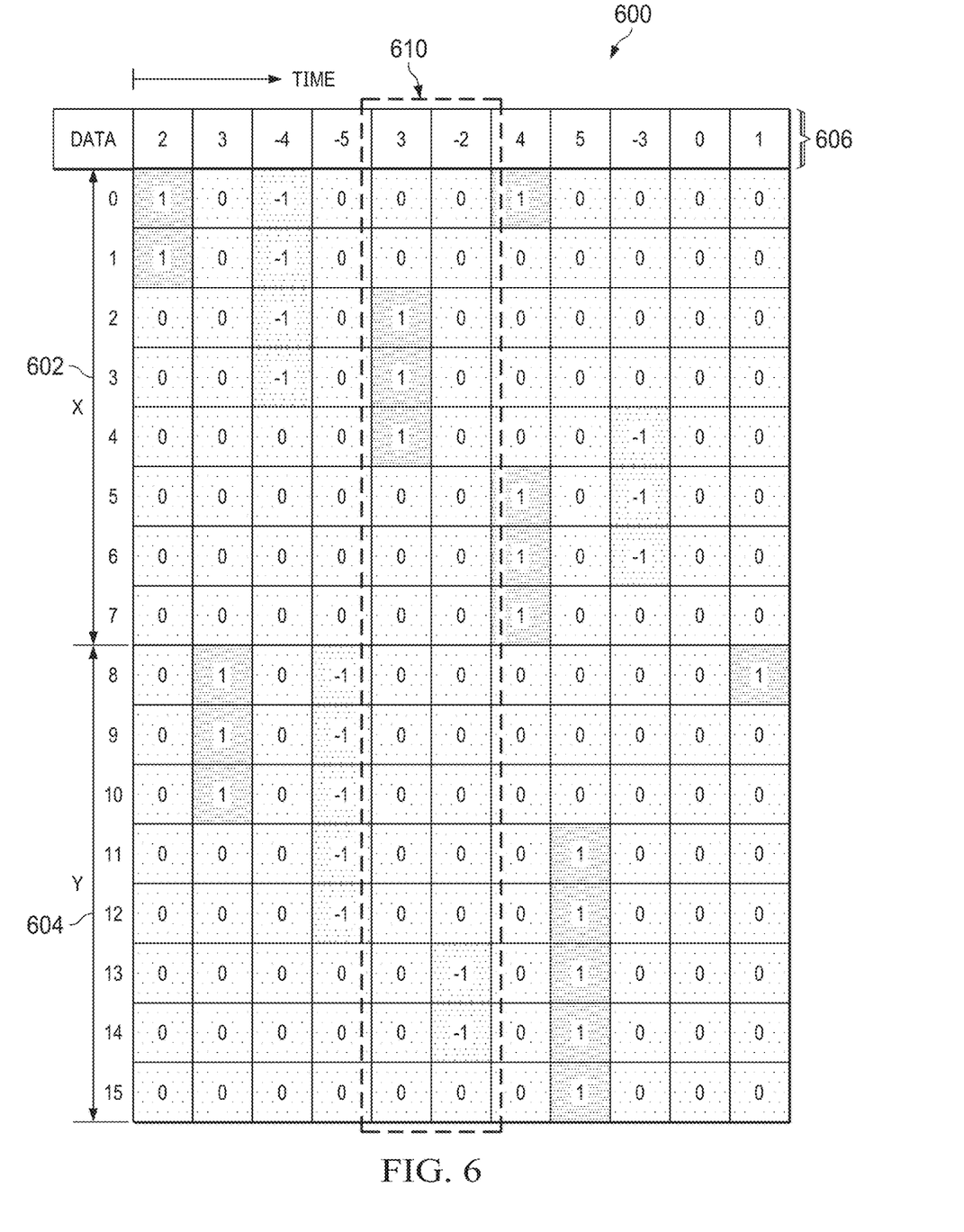
FIG. 6 is a diagram showing an example of a selection vector generated for placement of data in DAC unit elements according to the method of FIG. 5.

As further example, FIG. 6 is a diagram 600 showing an example of a selection vector generated for placement of a series of input data that is received over time according to the method of FIG. 5. Accordingly, the description of FIG. 6 also refers to FIG. 5. In the example of FIG. 6, the DAC includes 16 UEs (e.g., numbered 0 to 15 in the far-left column of the diagram 600. The UEs are shown split into segments X and Y, in which segment X includes UEs 0 to 7 and segment Y includes UEs 8 to 15. The diagram 600 also includes input values, shown at 606 (e.g., 2, 3, −4, −5, 3, −2, 4, 5, −3, 0, and 1), which are received by the DAC over time. Thus, the method 500 is implemented to place bits of −1, 0, and 1 in selected UEs of one of the segments X or Y according to the respective input values with each clock cycle.

As shown, in FIG. 6, UE coverage is improved over existing approaches, which is at least partially because of independent pointers for positive and negative values for each of the segments, as described herein. Additionally, the method 500 results in no overlap between consecutive vectors that are of opposite sign. For example, the method 500 selects selection vector for segment Y instead of segment X for the transition from 3 to −2, as shown at 610. It can be demonstrated that, as long as the data during sign transition is less than half the number of unit elements, which is true in the case of multibit modulators, the method 500 can ensure a non-overlapping solution. Additionally, improved usage averaging can be achieved through the UEs because of the dual pointers for positive and negative values, as described herein.

Figure 7:
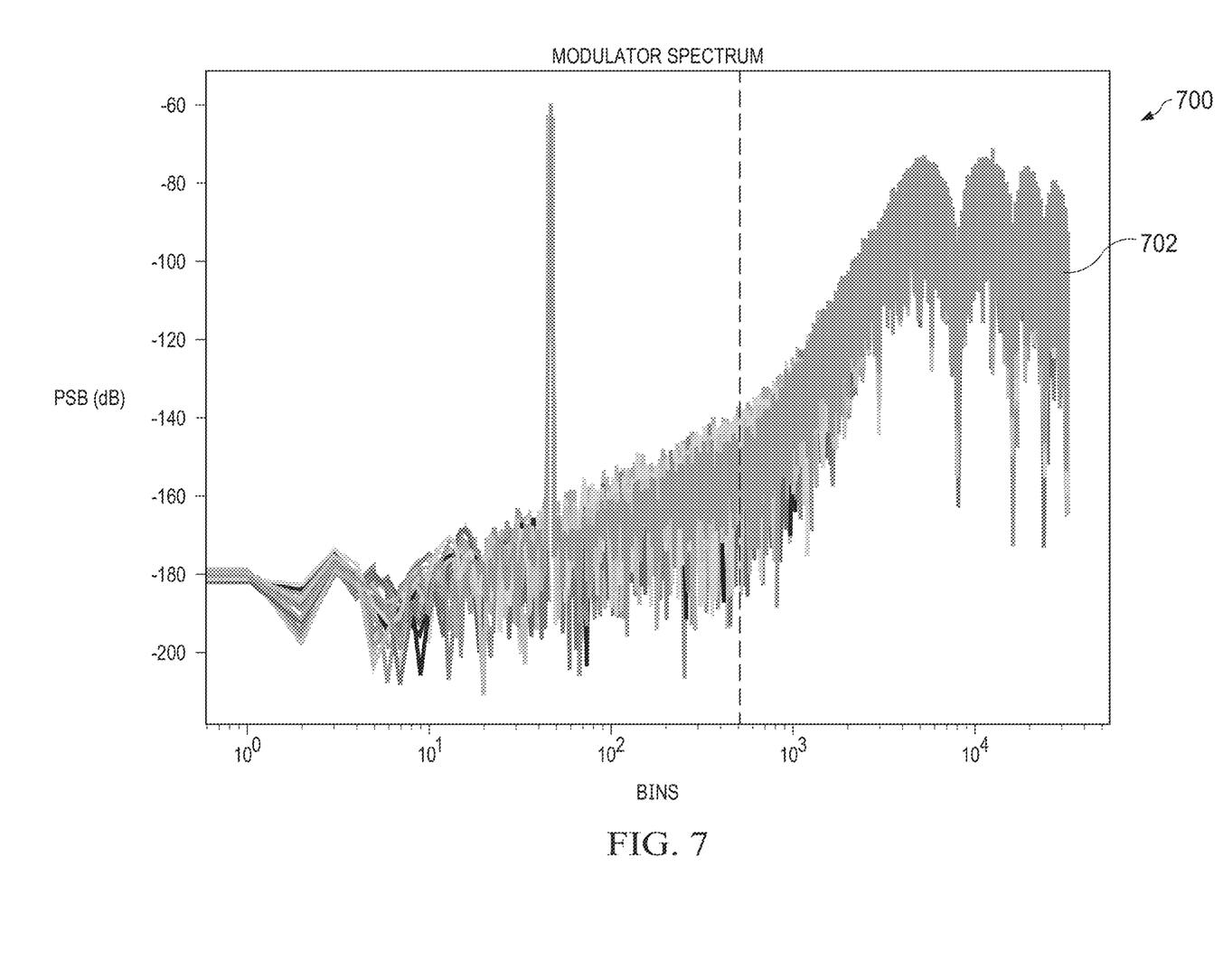
FIG. 7 is a plot showing a spectrum output provided by an example modulator circuit.

FIG. 7 is a plot 700 showing a spectrum output 702 over a frequency range (e.g., bins) provided by an example modulator circuit implementing a DAC as described herein. The spectrum output 702 is shown in FIG. 7 for −60 dBFS input. As shown, the modulator exhibits low noise, such as demonstrated by the absence of tones over frequency.

Figure 8:
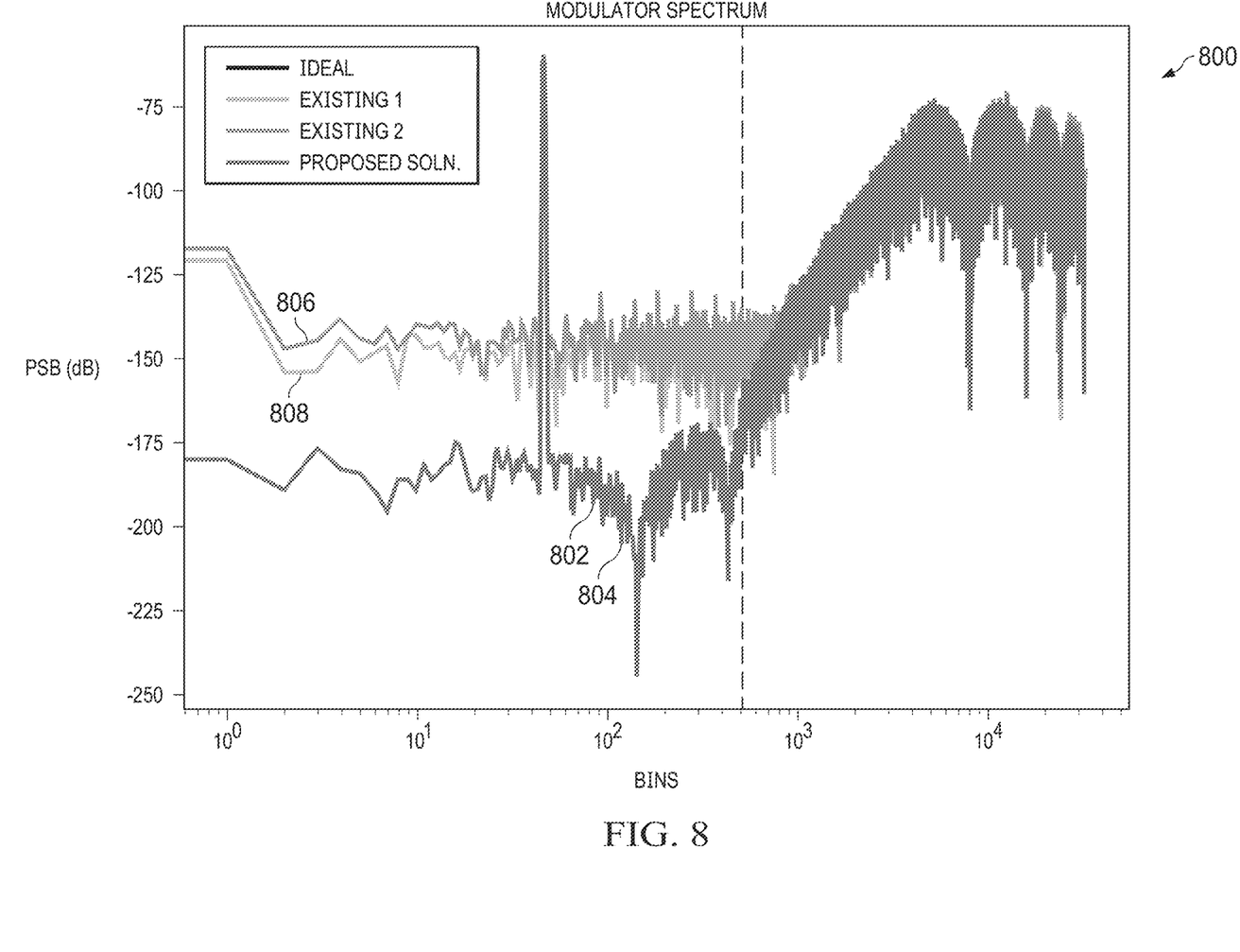
FIG. 8 is a plot showing comparison of spectrum outputs provided by different modulator circuits.

FIG. 8 is a plot 800 showing comparison of spectrum outputs 802, 804, 806, and 808 provided by different modulator circuits. The plot 802 is provided by a modulator implementing a DAC, as described herein, and the plot 804 represents a simulated spectral output for an ideal modulator. As shown in FIG. 8, the plot 802 exhibits comparable performance to the ideal modulator. By contrast, the plots 806 and 808, which are spectral outputs for modulators implementing two different existing DACs, exhibit significantly lower performance. The improved performance associated with plot 802 is due to reduced inter-symbol interference that occurs because the DAC can transition between 0 and +/−1 while avoiding overlap transitions with sign changes (e.g., between −1 and +1).

Figure 9:
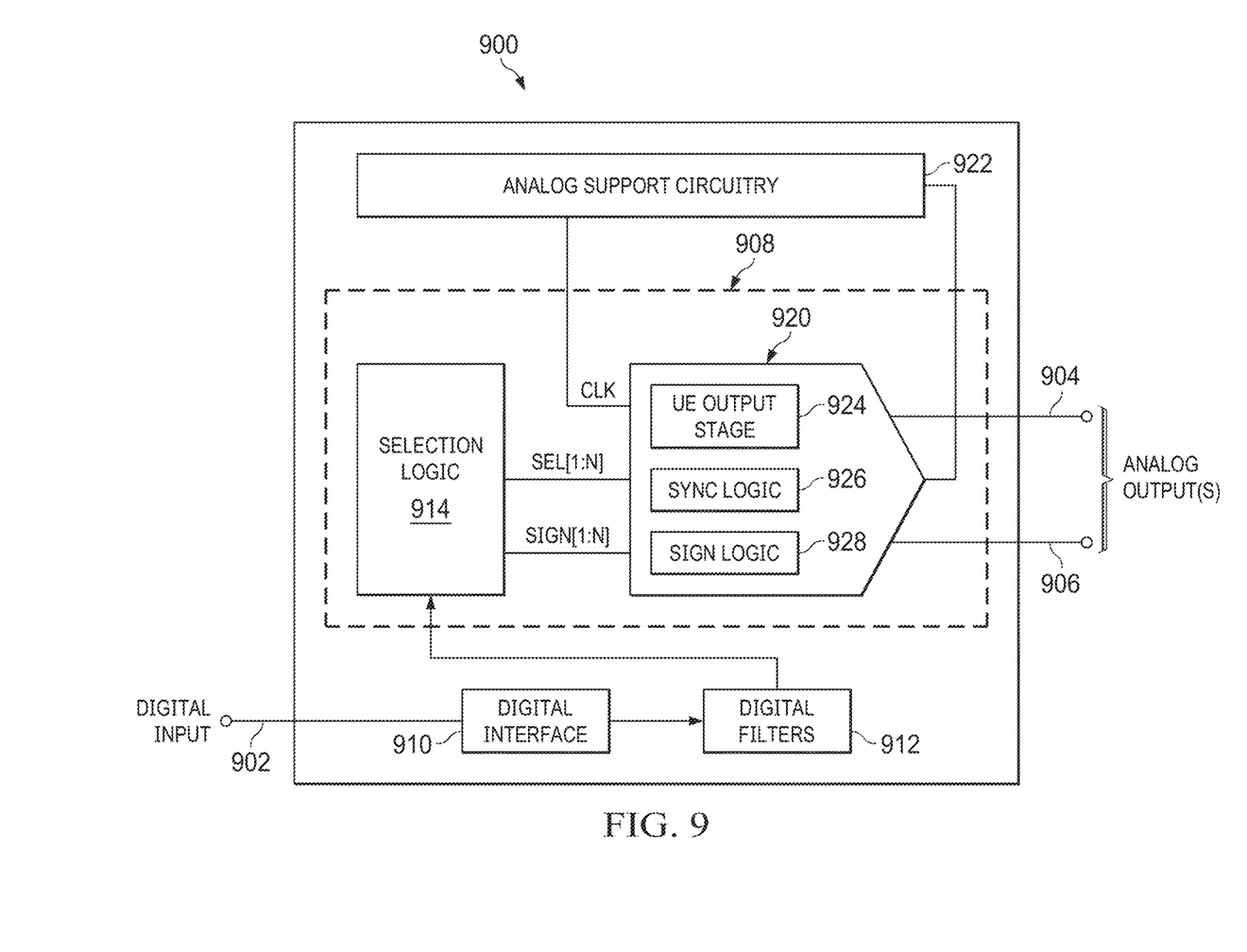
FIG. 9 is a block diagram showing an example DAC circuit.

FIG. 9 is a block diagram showing an example DAC circuit 900. The DAC circuit 900 can be implemented on or as part of an IC. The DAC circuit 900 includes a digital input 902 and one or more analog outputs 904 and 906 (e.g., a differential output). The circuit 900 includes a DAC 908, a digital interface 910, one or more digital filters 912, and analog support circuitry 922, which are coupled between the input 902 and outputs 904 and 906. The DAC 908 includes selection logic 914 and UE circuitry 920, which includes a number of UEs, as described herein. For example, the selection logic 914 can be implemented by the selection logic 106, which can be configured to perform the method 500 of FIG. 5. The UE circuitry 920 can be implemented by the UE circuitry 112 and 200 and thus include a number of UEs, such as any of UEs 118, 202, 300 and/or 400. As such, each instance of UE of the UE circuitry 920 thus includes a UE switch circuit 924, synchronizer logic 926 and sign logic 928.

For example, the digital interface 910 has one or more inputs coupled to the digital input 902 and thus receives the digital input signal. The digital filter 912 can perform corresponding filtering of the digital input signal received from the interface 910 and provide a digital filtered signal. The digital filter can be configured as a low-pass filter to remove the images of the input signal due to interpolation and/or a high-pass filter to remove DC signal components. The digital filter 912 can also include one or more configurable filters, which can be configured according to the use environment. The selection logic 914 can provide a selection signal and a sign control signal for each UE based on the filtered digital input signal. The circuit 900 also includes analog support circuitry 922, which includes an oscillator (e.g., a clock generator circuit) configured to provide a clock signal at a desired frequency for propagating digital data through the DAC 908.

Each instance of sign logic 926 can provide a pair of sign signals at respective sign outputs responsive to a sign input signal provided by the selection logic 914. Each instance of synchronizer logic 928 can provide synchronized selection signals responsive to the selection signal provided by the selection logic responsive to the filtered digital input signal. The UE circuitry 920 can provide an analog output signal at 104 representative of the value of the input data based on routing of input data (e.g., bits) to respective UEs thereof according to the selection signals and sign control signals received at 114 and 116, respectively, as described herein.

Figure 10:
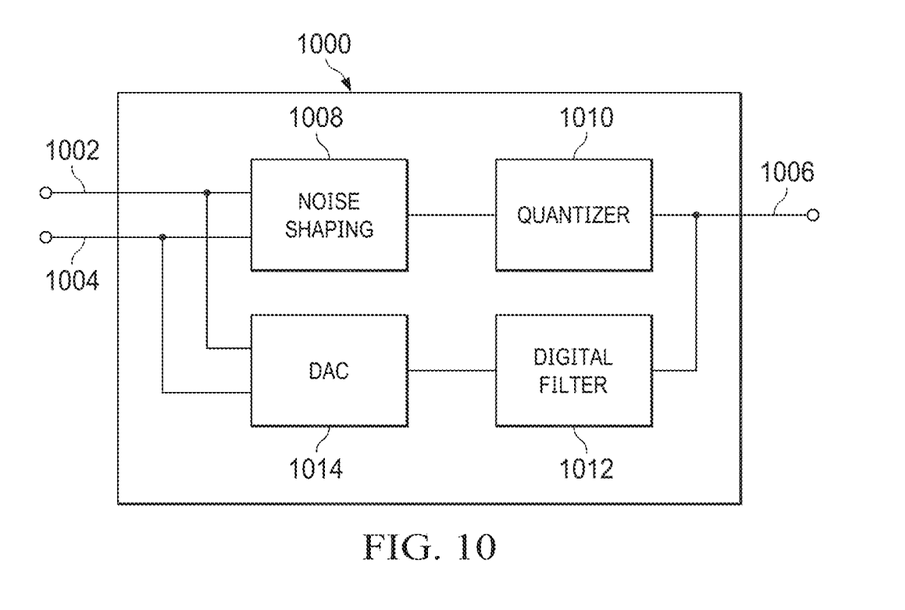
FIG. 10 is a block diagram showing an example modulator circuit that includes a DAC.

FIG. 10 is a block diagram showing an example modulator circuit 1000 that includes a DAC circuit 1014 implemented according to this description (e.g., circuit 100 or 900). The circuit 1000 can be implemented on or as part of an IC as well as on other types of circuits (e.g., system on chip or printed circuit board). The circuit 1000 has one or more inputs 1002 and 1004 and a digital output 1006. The circuit 100 includes a noise shaping block 1008, a quantizer 1010, a digital filter 1012, and a DAC 1014. In the example of FIG. 10, the noise shaping block 1008 can provide a noise-shaped output based on the digital input at 1002 and 1004, such as by shifting noise to high frequency bins away from data signals. The quantizer can process the noise-shaped signal and provide a quantized digital output signal (e.g., a multi-bit digital signal) at 1006. A feedback path includes the digital filter 1012 and the DAC 1014. The digital filter 1012 can provide a filtered digital signal based on the digital output signal provided at 1006. The DAC 1014 can convert the filtered digital signal to an analog signal (e.g., an analog differential signal), such as described herein. The analog signal can then be fed back into the inputs 1002 and 1004. The modulator circuit 1000 thus can be configured to provide a corresponding digital output at 1006 based on an analog input signal (e.g., a differential analog input signal) received at 1004 and 1006. The modulator circuit 1000 can be implemented as a delta sigma modulator analog-to-digital converter. The DAC circuit makes the modulator circuit well suited for high-performance applications (e.g., for audio or video applications, such as an audio codec), such as for use in a variety of environments, such as test and measurement applications, industrial, automotive, etc.

As described herein, a DAC (e.g., DAC 100, 900, 1014) can be configured to divide UEs of the DAC into segments, and use a pair of separate pointers for tracking positive and negative inputs for each of the segments. Additionally, each segment can use a pair of usage variables to track the segment usage for positive and negative data, respectively, as also described herein. The DAC implemented according to this description can route data to UEs of an appropriate segment in a way that reduces or avoids consecutive overlap transitions, as described herein. The DAC also can synchronize transitions effectively and efficiently between input data values. As a result, noise (e.g., inter-symbol interference) produced by such the DAC can be reduced significantly compared to existing DAC designs.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, a device that is "configured to" perform a task or function can be configured (e.g., programmed and/or hardwired) at a time of manufacturing by a manufacturer to perform the function and/or can be configurable (or reconfigurable) by a user after manufacturing to perform the function and/or other additional or alternative functions. The configuring can be through firmware and/or software programming of the device, through a construction and/or layout of hardware components and interconnections of the device, or a combination thereof. Furthermore, a circuit or device that is described herein as including certain components can instead be configured to couple to those components to form the described circuitry or device. For example, a structure described herein as including one or more semiconductor elements (such as transistors), one or more passive elements (such as resistors, capacitors, and/or inductors), and/or one or more sources (such as voltage and/or current sources) can instead include only the semiconductor elements within a single physical device (e.g., a semiconductor die and/or integrated circuit (IC) package) and can be configured to couple to at least some of the passive elements and/or the sources to form the described structure, either at a time of manufacture or after a time of manufacture, such as by an end-user and/or a third-party.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit comprising:
   a digital-to-analog converter (DAC) unit element switch circuit including first and second sign switch inputs, first and second select switch inputs, and first, second and third DAC outputs;
   synchronizer logic including a selection input and first and second synchronization outputs, in which the first synchronization output is coupled to the first select switch input and the second synchronization output is coupled to the second select switch input; and
   selection logic including a data input, a sign control output and a selection control output, in which the sign control output is coupled to the first and second sign switch inputs, and the selection control output is coupled to the selection input.

2. The circuit of claim 1, further comprising sign logic including a sign input and first and second sign outputs, in which the first sign output is coupled to the first sign switch input, the second sign output is coupled to the second sign switch input, and the sign control output is coupled to the sign input.

3. The circuit of claim 2, wherein the sign logic is configured to provide opposite sign signals at the first and second sign outputs responsive to a sign input signal at the sign input.

4. The circuit of claim 1, wherein the DAC unit element switch circuit comprises first, second, and third switch paths, in which each switch path includes a set of at least two switches coupled between a power supply terminal and a respective DAC output.

5. The circuit of claim 4, wherein:
the first switch path includes a first pair of switches coupled between the power supply terminal and the respective DAC output, in which one switch of the first pair of switches has a first control input coupled to the first sign switch input, and the other switch of the first pair of switches has a second control input coupled to the first select switch input,
the second switch path includes a second pair of switches coupled between the power supply terminal and the second DAC output, in which one switch of the second pair of switches has a third control input coupled to fixed voltage, and the other switch of the first pair of switches has a fourth control input coupled to the second select switch input, and
the third switch path includes a third pair of switches coupled between the power supply terminal and the third DAC output, in which one switch of the third pair of switches has a fifth control input coupled to the second sign switch input, and the other switch of the third pair of switches has a sixth control input coupled to the first select switch input.

6. The circuit of claim 1, wherein the synchronizer logic is configured to provide first and second synchronized selection signals at the first and second synchronization outputs, in which the first and second synchronized selection signals are inverted versions of each other responsive to a selection signal at the selection input, and the DAC unit element switch circuit is configured to transition between states responsive to the first and second synchronized selection signals.

7. The circuit of claim 6, wherein the DAC unit element switch circuit and the synchronizer logic define an instance of a unit element, the circuit includes N unit elements, in which N is a positive integer greater than two, and the selection logic is configured to divide the N unit elements into respective first and second segments of unit elements and provide the selection signal, as a selection vector, to control a number of the unit elements of a selected one of the first and second segments based on input data.

8. The circuit of claim 7, wherein the selection logic is configured to provide the selection signal to control the unit elements of the selected one of the first and the second segments based on an overlap score, in which the selection logic is configured to determine the overlap score responsive to detecting a sign change between previous and current values of the input data.

9. The circuit of claim 8, wherein the selection logic is configured to determine the overlap score for each of the first and second segments based on a previous value of the selection vector and each current instance of the selection vector according to the current value of the input data.

10. The circuit of claim 8, wherein the selection logic is configured to provide the selection signal based on a usage score, in which the selection logic is configured to determine the usage score for each of the first and second segments responsive to detecting no sign change between the previous and current values of the input data, and the usage score is determined for each of the first and second segments based on relative usage of the unit elements in each of the respective first and second segments.

11. The circuit of claim 7, wherein the selection logic is configured to select one of the first and second segments and provide the selection signal, as the selection vector, to place one or more bits representative of the input data such that there is no overlap between consecutive values of the input data having opposite signs.

12. The circuit of claim 11, wherein the selection logic is configured to implement a first pointer for tracking vector placement of positive values of the input data in each of the first and second segments and a second pointer for tracking vector placement of negative values of the input data in each of the first and second segments.

13. A circuit comprising:
a plurality of digital-to-analog converter (DAC) unit elements, in which each DAC unit element includes:
a unit element switch circuit configured to provide one of three values responsive to first and second sign output signals and first and second synchronization selection signals;
synchronizer logic configured to provide the first and second synchronization selection signals responsive to a selection signal;
sign logic configured to provide the first and second sign output signals responsive to a sign control signal; and
selection logic configured to divide the plurality of DAC unit elements into first and second segments and to provide the selection signal and the sign control signal to route input data to at least one DAC unit element of a given one of the first and second segments such that consecutive overlap transitions are prevented.

14. The circuit of claim 13, wherein the synchronizer logic is configured to provide the first and second synchronization selection signals as inverted versions of each other that are synchronized in time responsive to the selection signal.

15. The circuit of claim 13, wherein the selection logic is configured to provide the selection signal to unit elements in the given one of the first and the second segments based on an overlap score, in which the selection logic is configured to determine the overlap score responsive to detecting a sign change between previous and current values of the input data.

16. The circuit of claim 15, wherein the selection logic is configured to determine a respective overlap score for each of the first and second segments based on a previous instance of a selection vector and each current instance of the selection vector according to the current value of the input data.

17. The circuit of claim 15, wherein the selection logic is configured to provide the selection signal based on a usage score, in which the selection logic is configured to determine the usage score responsive to no sign change between the previous and current values of the input data, and the usage score is determined for each of the first and second segments based on relative usage of the unit elements in each of the respective first and second segments.

18. The circuit of claim 13, wherein the selection logic is configured to implement a first pointer for tracking placement of positive values of the input data in each of the first and second segments and a second pointer for tracking placement of negative values of the input data in each of the first and second segments.

19. An apparatus comprising:
- a digital interface including a digital input and a digital output;
- a digital filter including a filter input and a filter output, in which the filter input is coupled to the digital output;
- selection logic including a data input, a selection output, and a sign output, in which the data input is coupled to the filter output;
- a synchronizer logic circuit including a selection input, a clock input, and first and second synchronization outputs, in which the selection input is coupled to the selection output;
- a sign logic circuit including a sign input and first and second sign control outputs, in which the sign input is coupled to the sign output; and
- a digital-to-analog converter (DAC) unit element circuit including first and second sign switch inputs, first and second select switch inputs, and a DAC output, in which the first select switch input is coupled to the first synchronization output, the second select switch input is coupled to the second synchronization output, the first sign switch input is coupled to the first sign control output, and the second sign switch input is coupled to the second sign control output.

20. The apparatus of claim 19, wherein the DAC unit element circuit includes a plurality of N unit elements, where N is a positive integer greater than two, the selection logic includes N selection outputs and N sign outputs and is configured to divide the N unit elements into respective first and second segments of respective unit elements.

21. The apparatus of claim 20, wherein:
- the synchronizer logic circuit includes N synchronizer logic circuits, each configured to provide a pair of synchronization output signals responsive to a respective selection signal;
- the sign logic circuit include N sign logic circuits, each configured to provide a pair of sign output signals responsive to a respective sign control signal; and
- the selection logic is configured to provide N selection signals and N sign control signals to route input data to at least one DAC unit element of a given one of the first and second segments such that overlap transitions are prevented.

22. The apparatus of claim 21, wherein each of the N unit elements is configured to provide one of three output values responsive to a respective pair of the sign output signals and a respective pair of the synchronization output signals.

\* \* \* \* \*